United States Patent
Takano et al.

(10) Patent No.: US 6,363,406 B1
(45) Date of Patent: Mar. 26, 2002

(54) AUDIO DATA COMPRESSION/EXPANSION APPARATUS AND DIGITAL FILTER

(75) Inventors: Koji Takano, Ogaki; Fumiaki Nagao, Gifu, both of (JP)

(73) Assignee: Sanyo Electric Co., Ltd. (JP)

( * ) Notice: Subject to any disclaimer, the term of this patent is extended or adjusted under 35 U.S.C. 154(b) by 0 days.

(21) Appl. No.: 09/237,719

(22) Filed: Jan. 26, 1999

(30) Foreign Application Priority Data

Jan. 30, 1998 (JP) ............................................ 10-019404

(51) Int. Cl.[7] .............................................. G06F 17/10
(52) U.S. Cl. ...................................... 708/319; 316/320
(58) Field of Search ............................... 708/300, 303, 708/316, 319, 320

(56) References Cited

U.S. PATENT DOCUMENTS 5,319,584 A * 6/1994 Ooyabu ....................... 708/303
5,438,532 A   8/1995 Nagao et al.

FOREIGN PATENT DOCUMENTS

| JP | 06-216715 A | 8/1994 |
| JP | 06-216716 A | 8/1994 |
| JP | 07-131295 A | 5/1995 |

OTHER PUBLICATIONS

Claude R. Garland and Henri J. Nussbaumer. "New Quadrature Mirror Filter Structures." *IEEE Transactions on Acoustics, Speech, and Signal Processing* vol. ASSP–32, No. 3, Jun. 1984, pp. 522–531.

* cited by examiner

*Primary Examiner*—Chuong Dinh Ngo
(74) *Attorney, Agent, or Firm*—Cantor Colburn LLP

(57) ABSTRACT

The processing of a digital filter (52) switches between the separation of audio data and the synthesis of a plurality of band data. An attenuator (51), one end of which is connected to the digital filter (52) and the other end is connected to the audio data input-output port, attenuates the input audio data and supplies it to the digital filter and attenuates and outputs the audio data that has been output from the digital filter (52). The attenuator (51) and the digital filter (52) are commonly used for both data compression and data expansion processing and therefore the entire circuit size of an audio data compression/expansion apparatus is reduced.

3 Claims, 13 Drawing Sheets

| | | | | | | | | | | | |
|---|---|---|---|---|---|---|---|---|---|---|---|
| INPUT DATA | X(8) | X(9) | | | | | | | | | X(10) |
| RAM WRITE | | X(8) | | | | | | | | X(9) | |
| RAM READ | | | X(8) | X(6) | X(4) | X(2) | X(7) | X(5) | X(3) | X(1) | |
| ROM READ | | | h(0) | h(2) | h(4) | h(6) | h(1) | h(3) | h(5) | h(7) | |
| REGISTER | | | | A(1) | A(2) | A(3) | A(4) | B(1) | B(2) | B(3) | B(4) |
| FIRST REGISTER | | | | | | | A(4) | | | | |
| SECOND REGISTER | | | | | | | | | | | B(4) |
| FIRST OUTPUT REGISTER (OUTPUT DATA) | | | | | | | | | | Yb(4) | Ya(4) |

Fig. 3

| | | | | | | | | | | | | |
|---|---|---|---|---|---|---|---|---|---|---|---|---|
| INPUT DATA | Xb(4) | | | Xa(5) | | | Xb(5) | | | | | |
| FIRST REGISTER | | | Xa(4) | | | Xa(5) | | | | | | |
| SECOND REGISTER | | | Xb(4) | | | | | Xb(5) | | | | |
| RAM WRITE | Xa(4)·Xb(4) | | | | | Xa(4)·Xb(4) | | | Xa(5)·Xb(5) | | | | |
| RAM READ | | Xa(3)·Xb(3) | Xa(2)·Xb(2) | Xa(1)·Xb(1) | | | Xa(4)·Xb(4) | Xa(3)·Xb(3) | Xa(2)·Xb(2) | Xa(1)·Xb(1) | | |
| ROM READ | h(0) | h(2) | h(4) | h(6) | | h(1) | h(3) | h(5) | h(7) | | |
| REGISTER | | A(1) | A(2) | A(3) | A(4) | | B(1) | B(2) | B(3) | B(4) | | |
| SECOND OUTPUT REGISTER (OUTPUT DATA) | Y(7) | | | | Y(8) | | | | Y(9) | | | |

Fig. 4

AUDIO DATA COMPRESSION/EXPANSION APPARATUS AND DIGITAL FILTER

BACKGROUND OF THE INVENTION

1. Field of the Invention

The present invention relates to an audio data compression/expansion apparatus that compresses audio data when audio sound is recorded, and to expands the compressed data when audio sound is reproduced and a digital filter used for this audio data compression/expansion apparatus.

2. Description of the Related Art

A Finite Impulse Response (FIR) type digital filter is constructed so that output data Y(n) will be produced by convoluting input data X(n) and impulse responses, as expressed by equation (1).

$$Y(n) = \sum_{k=0}^{N-1} h(k) \cdot X(n-k) \quad (1)$$

where, h(k) is a filter coefficient and N is the number of taps. When transformed with regard to Z, the equation (1) will be as follows:

$$H(z) = \sum_{n=0}^{N-1} h(n) \cdot Z^{-n} \quad (2)$$

The equation (2) will be further transformed as follows:

$$H(e^{j\omega}) = \sum_{n=0}^{N-1} h(n) \cdot e^{-j\omega n} \quad (3)$$

The equation (3) determines a frequency response. Assuming that $\omega = 2\pi k/N$, the equation (3) will be as follows:

$$H(e^{j\omega}) = \sum_{n=0}^{N-1} h(n) \cdot e^{j2\pi nk/N} \quad (4)$$

This equation (4) may be regarded as an expression of Discrete Fourier Transformation (DFT). Thus, the filter coefficient h(k) is obtained through Inverse Discrete Fourier Transformation (IDFT) of the frequency characteristic given by the equation 4.

FIG. 9 shows the circuit of a standard FIR type digital filter.

In this filter circuit, a plurality of delay elements 1, which may be, for example, shift registers, are connected in series with each other and each of these elements delays the input data X(n) a certain period T. This circuit also has a plurality of multipliers 2, the first multiplier connected to the input data X(n) carrying line to the first delay element 1 and the remaining connected to the output line from each delay element 1. The first multiplier 2 multiplies the input data X(n) by a given filter coefficient h(k) and the remaining multipliers 2 multiply the output from each delay element 1 by the same filter coefficient h(k). In this way, the input data X(n) is convoluted with the impulse responses.

A total sum adder 3, included in this circuit, sums up the outputs from all the multipliers 2, that is, the input data X(n) and the outputs from all delay elements 1 after being multiplied by the predetermined filter coefficient h(k), and produces output data Y(n). Consequently, the input data X(n) has now been processed, subject to the arithmetic operation in compliance with the above-mentioned equation (1).

Because an array of delay elements 1 and multipliers 2, corresponding to the number of taps N are required, this type of digital filter has a problem that its entire circuit size becomes larger as the number of the taps increases. Therefore, a digital filter using a stored program method has been proposed which stores time-series input data in a memory once and sequentially multiplies the input data by the filter coefficient after reading it from the memory, while accumulating the product of each multiplication.

FIG. 10 shows a block diagram representing the digital filter using the stored program method.

In this block diagram, a RAM 11 sequentially stores time-series input data X(n) that has been input to it from moment to moment. A plurality of filter coefficients h(k) are stored in a ROM 12. Input data X(n) stored in the RAM 11 is read out at its arithmetic step and from the ROM 12 a step-specific filter coefficient h(k) with a value of k incrementing step by step is read out, where k corresponds to the k described in equation (1). Then, a multiplier 13 multiplies the input data X(n−k) read from the RAM 11 by the filter coefficient h(k) read from the ROM 12.

An accumulator 14, consisting of an adder 15 and a register 16, accumulates the product of each multiplication executed by the multiplier 13. Specifically, the adder 15 adds the output from the multiplier 13 and the output from the register 16 and the resultant sum is stored into the register 16 again. In this way, the product of each multiplication executed by the multiplier 13 is heated up sequentially. An output register 17 receives an accumulation value output from the accumulator 14 and outputs it as output data Y(n).

After reading the input data X(n) and the filter coefficient h(k) sequentially from the RAM 11 and ROM 12, respectively, the FIR type digital filter repeats the product sum arithmetic operation and produces the output data Y(n), thus processing the arithmetic of equation (1). This type of a digital filter does not become large, even if the filter circuit includes a large number of taps N.

One digital filter is assumed to have the first filter coefficient h1(n), whereas another digital filter is assumed to have the second filter coefficient h2(n) given by the following equation:

$$h_2(n) = (-1)^n \cdot h_1(n) \quad (5)$$

The latter digital filter is referred to as a mirror filter because of its frequency response characteristics. The arithmetic relation of this filter with Z transformation can be expressed as follows:

$$H_2(z) = \sum_{n=-\infty}^{\infty} Z^{-n} \cdot h_2(n) \quad (6)$$

$$= \sum_{n=-\infty}^{\infty} Z^{-n} \cdot (-1)^{-n} \cdot h_1(n)$$

$$= H_1(-Z)$$

When we consider the frequency response characteristics of the filter, the following equation is obtained:

$$h_2(n) = \theta^{j\pi n} \cdot h_1(n) \quad (7)$$

When equation (7) is assigned to equation (6), the following equation is derived:

$$H_2(\theta^{j\omega}) = H_1(e^{j\omega + j\pi}) \quad (8)$$

From equation (8), the frequency response characteristics of the mirror filter are symmetric with regard to π/2. Because π/2 is ¼ of the sampling period, the mirror filter is called a Quadrature Mirror Filter (QMF). A QMF of this kind is detailed in a publication "IEEE Transactions on Acoustics Speech and Signal Processing" (Vol. ASSP-32, No. 3, June, 1984, pp. 522–531).

A separation filter in which the above-mentioned QMF separates the input data into frequency components in different bands is constructed to produce two output data Ya(n) and Yb(n) which have been separated from the input data X(n). This filter convolutes the input data X(n) with the impulse responses and executes adding and subtracting calculations on the data obtained from the convolution process, as expressed by equations (9) and (10).

$$Ya(n) = \sum_{k=N-1}^{0} h(2k) \cdot X(2n-2k) - \sum_{k=N-1}^{0} h(2k+1) \cdot X(2n-2k+1) \quad (9)$$

$$Yb(n) = \sum_{k=N-1}^{0} h(2k) \cdot X(2n-2k) + \sum_{k=N-1}^{0} h(2k+1) \cdot X(2n-2k+1) \quad (10)$$

FIG. 11 shows a block diagram representing the structure of the separation filter in which data separation into different frequency bands is performed according to equations (9) and (10).

As shown in this block diagram, a plurality of delay elements 21 are serially connected and each of these elements delays the input data X(n) a certain period T. Of a plurality of first multipliers 22, one is connected to the input data X(n) carrying line to the first delay element 21 and the remaining multipliers 22 are connected to the output line from each of the delay elements 21 located in the even number stages. The first multipliers 22 multiply the input data X(n) and the outputs from these delay elements 21 by a filter coefficient h(2k). There are also a plurality of second multipliers 23 connected to the output line from each of the delay elements 21 located in the odd number stages. The second multipliers 23 multiply the outputs of these delay elements 21 by a filter coefficient h(2k+1). In this way, the input data X(n) is convoluted with the impulse responses.

A first total sum adder 24 sums up the outputs from all first multipliers 22 and outputs intermediate data An. On the other hand, a second total sum adder 25 sums up the outputs from all second multipliers 23 and outputs intermediate data Bn.

A subtracter 26 subtracts the intermediate data Bn supplied by the second total sum adder 25 from the intermediate data An supplied by the first total sum adder 24, and outputs the first output data Ya(n). An adder 27 adds the intermediate data An supplied by the first total sum adder 24 and the intermediate data Bn supplied by the second total sum adder 25 and outputs the second output data Yb(n). In this way, the filter circuit accomplishes the arithmetic operation in compliance with the equations (9) and (10).

On the other hand, a synthesis filter in which the above-mentioned QMF synthesizes the input data frequency components existing in separate bands is constructed to produce an output data Y(n) into which the input data Xa(n) and Xb(n) are combined. This filter convolutes the values obtained by adding and subtracting calculations on the first and the second input data Xa(n) and Xb(n) with the impulse responses, as expressed by equations (11) and (12).

$$Y(2n) = \sum_{k=0}^{N-1} h(2k)\{Xa(n-k)Xb(n-k)\} \quad (11)$$

$$Y(2n+1) = \sum_{k=0}^{N-1} h(2k+1)\{Xa(n-k) + Xb(n-k)\} \quad (12)$$

FIG. 12 shows a block diagram representing the structure of the synthesis filter in which the synthesis of separate frequency bands is performed in accordance with the equations (11) and (12).

AS shown in this block diagram, a subtracter 31 subtracts the second input data Xb(n) from the first input data Xa(n) and an adder 32 adds the first and the second input data Xa(n) and Xb(n). A changeover switch 33 alternately switches the output between the output from the subtracter 31 and the output from the adder 32.

A plurality of delay elements 34 are serially connected and each of these elements delays the output from the subtracter 31 or the output from the adder 32 a certain period T. Of a plurality of first multipliers 35, one multiplier 35 is connected to the output line from the switch 33 and the remaining are connected to the output line from each of the delay elements 34 located in the even number stages. The first multipliers 35 multiply the switch 33 output and the outputs from these delay elements 35 by a filter coefficient h(2k). Also included are a plurality of second multipliers 36 connected to the output line from each of the delay elements 34 located in the odd number stages. The second multipliers 36 multiply the outputs of these delay elements 34 by a filter coefficient h(2k+1). The main filter circuit section described above allows the values obtained by adding and subtracting calculations on the first and the second input data Xa(n) and Xb(n) to be convoluted with the impulse responses.

A first total sum adder 37 sums up the outputs from all first multipliers 35 and outputs intermediate data An. On the other hand, a second total sum adder 38 sums up the outputs from all second multipliers 36 and outputs intermediate data Bn. A changeover switch 39 alternately switches between the intermediate data An and the intermediate data Bn in synchronization with the changeover switch 33 and outputs the output data Y(n). In this way, the filter circuit accomplishes the arithmetic operation in compliance with equations (11) and (12).

The Applicant previously proposed constructing the separation and synthesis filters described above by using the above-mentioned stored program method. The details of this proposal are disclosed in Japanese Patent Laid-Open Publications No. Hei 6-216715 and No. Hei 7-131295.

FIG. 13 is a block diagram showing the structure of an example known audio data compression/expansion apparatus that compresses audio data for sound recording operation and expands the compressed data read from a recording medium for sound reproducing operation.

When sound recording operation, that is, data compression, is executed, an attenuator 41, a digital filter 42, a Modified Discrete Cosine Transformation (MDCT) circuit 43, and a quantization circuit 44 operate to generate compressed data by compressing audio data that is input to the attenuator 41.

The attenuator 41 receives audio data consisting of A/D converted audio signals and attenuates the audio data as required. The digital filter 42, which is, for example, a QMF shown in FIG. 11, separates the audio data which has been input to it via the attenuator 41 into data components in their specific frequency bands, thus generating a plurality of band data. The MDCT circuit 43 executes discrete cosine transformation of the band data which has been input to it from the digital filter 42, thus generating coefficient data corresponding to each band data. Then, the quantization circuit 44 quantizes the coefficient data which has been input to it from the MDCT circuit 43 in accordance with a predetermined quantization table, thus generating compressed data. The MDCT 43 and quantization 44 circuits normally carry out the arithmetic for a plurality of band data on a time-sharing basis.

When sound reproducing operation, that is, data expansion, is executed, an inverse quantization circuit 45, an Inverse Modified Discrete Cosine Transformation (IMDCT) circuit 46, a digital filter 47, and an attenuator 48 operate to reproduce audio data by expanding the compressed data read from a given recording medium. The inverse quantization circuit 45 generates coefficient data corresponding to the coefficient data generated by the MDCT circuit 43, referring to the same quantization table as used by the quantization circuit 44 in the data compression system. The IMDCT circuit 46 executes inverse transformation, which inverts the transformation made by the MDCT circuit 43, and generates band data corresponding to the band data generated by the digital filter 42. The digital filter 47, which may be, for example, a QMF shown in FIG. 12, synthesizes the band data existing in separate frequency bands, input to it from the IMDCT circuit 46, into audio data. Then, the attenuator 48 attenuates, as required, the audio data which has been input to it from the digital filter 47 and supplies the data to a circuit in the subsequent stage which includes a D/A converter and a amplifier. The inverse quantization 45 and IMDCT 46 circuits carry out the arithmetic for a plurality of band data on a time-sharing basis, as do the MDCT 43 and quantization 44 circuits. Thus, a plurality of band data inputs to the digital filter 47 occur on a time-sharing basis.

A digital audio device that enables audio sound recording and reproducing, such as a mini-disc (MD) player, has both data compression and data expansion system circuits installed in parallel as shown in FIG. 13; the data compression system circuitry includes the components from the attenuator 41 up to the quantization circuit 44 and the data expansion system circuitry includes the components from the inverse quantization circuit 45 up to the attenuator 48. Since multipliers are normally used to handle digital data in the attenuators 41 and 48 and the digital filters 42 and 47, there arises a problem that the entire circuit size increases as the number of bits of data to be processed increases. The increase of the circuit size causes the circuit to consume more electric power, which results in the increase of cost.

SUMMARY OF THE INVENTION

An object of the present invention is to decrease the entire circuit size of an audio data compression/expansion apparatus that enables audio data sound recording and reproducing.

According to the audio data compression/expansion apparatus circuitry offered by the invention, a single digital filter is designed to operate so as to switch over between processing audio data separation and processing band data synthesis and a single attenuator is thus adequate to attenuate audio data that is input to and output from the digital filter.

According to the digital filter offered by the invention, the processing executed by a multiplier and an accumulator and the processing executed by an adder-subtracter are switched over by selector switchover. This allows the digital filter to switch over between processing audio data separation and processing band data synthesis. The multiplier that multiplies audio data by a filter coefficient is also used to multiply audio data by an attenuation coefficient. Thus, one multiplier can serve as a component of the digital filter and a component of the attenuator.

BRIEF DESCRIPTION OF THE DRAWINGS

FIG. 3 is an internal data flow timing chart explaining the data separating operation executed by the digital filter shown in FIG. 2.

FIG. 4 is an internal data flow timing chart explaining the data synthesis operation executed by the digital filter shown in FIG. 2.

DETAILED DESCRIPTION OF THE PREFERRED EMBODIMENTS

Figure 1:
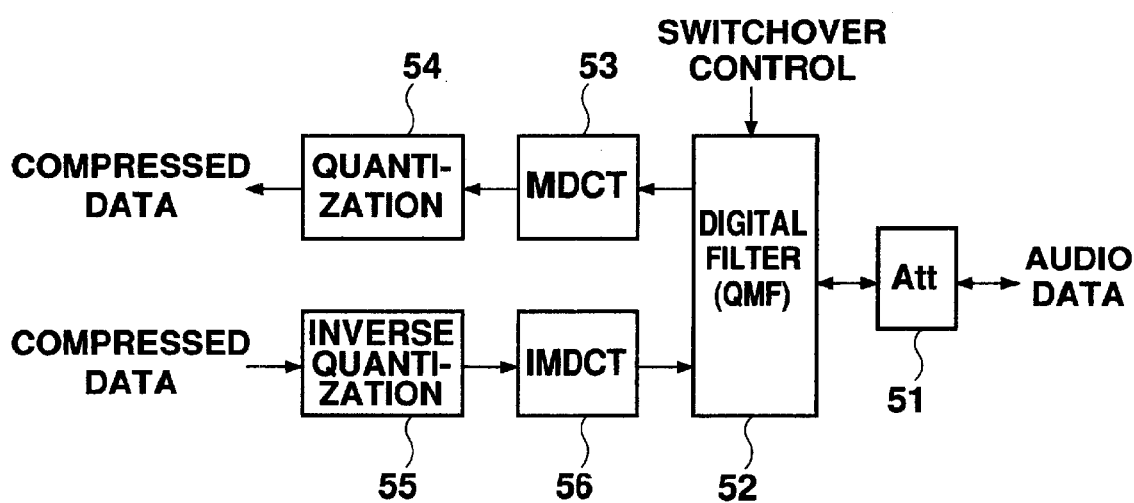
FIG. 1 is a block diagram showing an audio data compression/expansion apparatus configured according to a first embodiment of the present invention.

FIG. 1 is a block diagram showing an audio data compression/expansion apparatus configured in accordance with a first embodiment of the present invention.

Figure 13:
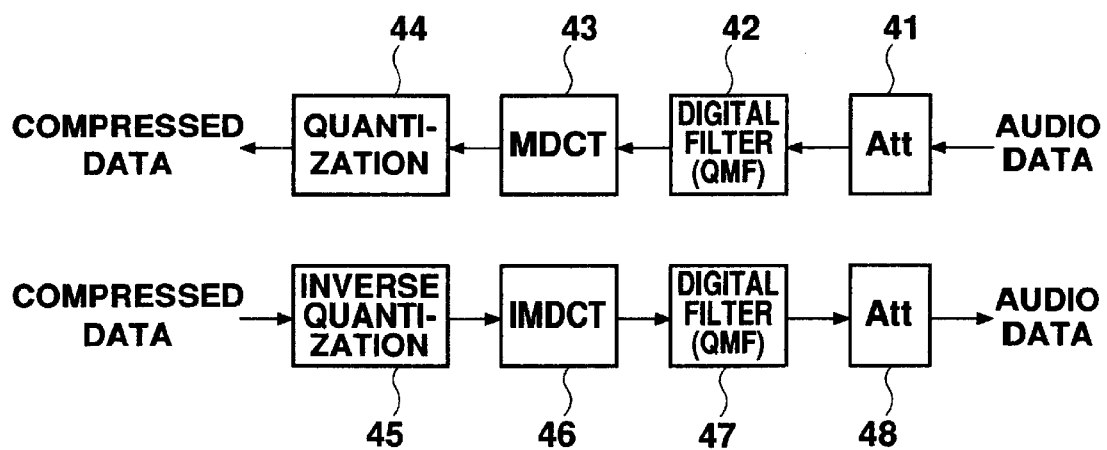
FIG. 13 is a block diagram showing the structure of a predecessor audio data compression/expansion apparatus.

MDCT 53, quantization 54, inverse quantization 55, and IMDCT 56 circuits shown in FIG. 1 correspond to the MDCT 43, quantization 44, inverse quantization 45, and IMDCT 45 circuits shown in FIG. 13. The audio data compression/expansion apparatus shown in FIG. 1 is configured such that the MDCT 53 and quantization 54 circuits generate compressed data from the band data generated by a digital filter 52 and the inverse quantization 55 and IMDCT 56 circuits generate band data to be input to the digital filter 52 from the compressed data.

A primary feature of the present invention is that the digital filter 52 is able to switch over between processing audio data compression and processing band data separation and an attenuator 51 which permits bidirectional data input and output is connected to the digital filter 52.

The attenuator 51 is designed so that bidirectional data input and output can be performed by the switchover between input and output pins, its one end connected to the audio data input-output port and the other end connected to the digital filter. This bidirectional data input and output capability allows the attenuator 51 to attenuate input audio data and supply it to the digital filter 52 and attenuate the audio data output from the digital filter 52 and supply it to a circuit in the subsequent stage.

The digital filter 52 includes a multiplier, an accumulator, and an adder-subtracter. The switchover action of the selectors connected to either end of these arithmetic units enables the digital filter to execute audio data separation processing and band data synthesis possessing. When carrying out data separation, the digital filter 52 is designed to execute the multiplication of audio data by certain coefficients and accumulate each multiplication product before executing adding and subtracting calculations on two accumulation values in order to generate band data. When carrying out data synthesis, the digital filter 52 is designed to execute adding and subtracting calculations on a plurality of band data before multiplying each adding or subtracting calculation value by a certain coefficient and accumulating each multiplication product in order to generate audio data.

This digital filter 52 is larger than the digital filters 42 and 47 shown in FIG. 13 in terms of the physical circuit size of a single digital filter because the selectors to change the arithmetic processing sequence are included. However, the digital filter 52 accomplishes the corresponding function of the two digital filters 42 and 47, using the same arithmetic units for processing both audio data compression and band data expansion, and its virtual circuit size is therefore reduced.

The above audio data compression/expansion apparatus includes one attenuator 51 and one digital filter 52 and its entire circuit size is reduced as compared with the device shown in FIG. 13. Ordinary data compression/expansion apparatuses do not execute data compression and expansion at the same time. By operating the attenuator 51 and the digital filter 52 on a time-sharing basis, the capability of such device can be achieved adequately.

Figure 2:
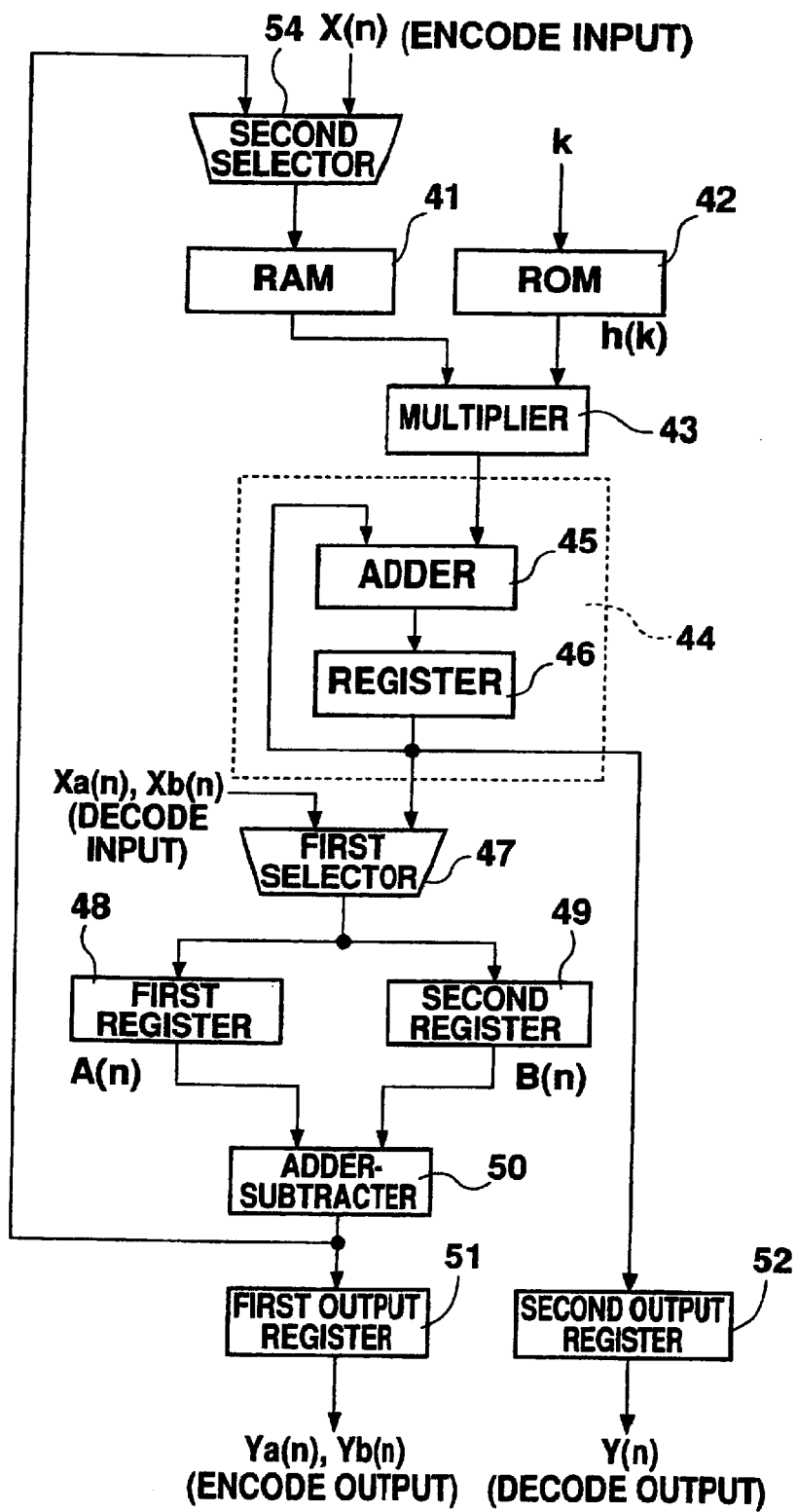
FIG. 2 is a block diagram showing the structure of a digital filter used in the audio data compression/expansion apparatus shown in FIG. 1.

FIG. 2 is a block diagram showing the strucutre of the digtal filter 52 shown in FIG. 1. FIGS. 3 and 4 are internal data flow timing charts, intended to explain the operation of the digital filter, where input data X(n) is audio data which is input to a separation filter, output data Ya(n) and Yb(n) are band data which are output from the separation filter, input data Xa(n) and Xb(n) are band data which are input to a synthesis filter, and output data Y(n) is audio data which is output from the synthesis filter.

In FIG. 2, a RAM 61, connected to a second selector 74 which will be explained later, stores for a given period the time-series data which has been input to it from the second selector 74. Each data stored in the RAM 61 is sequentially read out for its arithmetic processing step. From a ROM 62, in which a plurality of filter coefficients h(k) have previously been stored, a step-specific filter coefficient h(k) with a value of k incrementing step by step is read out repeatedly, where k corresponds to the k given in the above-mentioned equations (9) through (12). A multiplier 63, connected to the RAM 61 and the ROM 62, multiplies the data read from the RAM 61 by the filter coefficient h(k) read from the ROM 42. An accumulator 64 consisting of an adder 65 and a register 66 is connected to the multiplier 63. The accumulator 64 accumulates the product of multiplication executed by the multiplier 63 in accordance with the number of taps. To be exact, the adder 55 adds the data read from the register 66 and the multiplication product data supplied from the multiplier 63 and the resultant sum is stored into the register 66 again. In this way, the product of each multiplication executed by the multiplier 63 is accumulated.

A first selector 67, connected to the accumulator 64 and the decode input, selects and outputs either the accumulation data supplied from the accumulator 64 or time-series band data Xa(n) and Xb(n). From the decode input, one of the two band data Xa(n) and Xb(n) is alternately input to the first selector 67 on a time-sharing basis. A first register 68 and a second register 69 are connected to the first selector 67. These registers 68 and 69 alternately receive and store the data which is continuously supplied from the first selector 67, so that either accumulation data or band data Xa(n) and Xb(n) will be written into one of the registers. Then, the registers 68 and 69 output the stored data at a given timing, respectively. For example, these registers are designed such that data A(n) which is output from the first selector 67 at first and subsequent odd number intervals will be stored into the first register 68 and data B(n) which is output from the first selector 67 at second and subsequent even number intervals will be stored into the second register 69. An adder-subtracter 70, connected to the first register 68 and the second register 69, executes subtracting or adding calculation on the data A(n) and B(n) read from the registers 68 and 69. A second selector 74, connected to the adder-subtracter 70 and the encode input, selects and outputs either the adding/subtracting calculation data supplied from the adder-subtracter 70 or time-series audio data X(n) supplied from the encode input.

A first output register 71, connected to the adder-subtracter 70, stores the adding/subtracting calculation data supplied from the adder-subtracter 70 whenever the adder-subtracter 70, completes an arithmetic processing, and outputs band data Ya(n) and Yb(n). In response to the adder-subtracter 70 alternately repeating addition and subtraction, for example, the register 71 outputs the subtracting calculation data as band data Ya(n) and the adding calculation data as band data Yb(n). The output from the first output register 71 becomes an encode output. A second output register 72, connected to the accumulator 64, stores the accumulation data supplied from the accumulator 64 whenever the accumulator completes required arithmetic processing, and outputs audio data Y(n). The output from the second output register 72 becomes a decode output.

The digital filter, with components as outlined above, acts as a separation filter when the first selector 67 selects the accumulation data from the accumulator 64 and the second selector 74 selects audio data X(n). The digital filter operating in this mode produces band data Ya(n) and Yb(n) from the audio data X(n) and outputs the band data Ya(n) and Yb(n) through the first output register 71. When the first selector 67 selects band data Xa(n) and Xb(n) and the second selector 74 selects the adding/subtracting calculation data supplied from the adder-subtracter 70, the digital filter acts as a synthesis filter and outputs data Y(n) produced by the synthesis of the band data Xa(n) and Xb(n) through the second output register 72.

FIG. 3 shows an internal data flow timing chart illustrating the separation filter operation of the digital filter configured as shown in FIG. 2 in an example where there are 4 taps, that is, n=4. In the separation filter mode, the first selector 67 selects the accumulation data from the accumulator 64 and the second selector 74 selects audio data X(n).

To recalculate equations (9) and (10) using n=4, the calculation for equation (9) will be as follows:

$$Ya(n) = h(6) \cdot X(2n-6) + h(4) \cdot X(2n-4) + h(2) \cdot X(2n-2) + \quad (13)$$
$$h(0) \cdot X(2n) - h(7) \cdot X(2n-7) - h(5) \cdot X(2n-5) -$$
$$h(3) \cdot X(2n-3) - h(1) \cdot X(2n-1)$$

Equation (10) will be as follows:

$$Yb(n) = h(6) \cdot X(2n-6) + h(4) \cdot X(2n-4) + h(2) \cdot X(2n-2) + \quad (14)$$
$$h(0) \cdot X(2n) + h(7) \cdot X(2n-7) + h(5) \cdot X(2n-5) +$$
$$h(3) \cdot X(2n-3) + h(1) \cdot X(2n-1)$$

Audio data X(8) shown in FIG. 3 is written into the RAM 61 via the second selector 74. Although FIG. 3 omits the writing of audio data X(0) to X(7), it is assumed that the data X(0) to X(7) have been input prior to the audio data X(8) and stored into the RAM 61.

When the audio data X(8) is first read from the RAM 61 and its corresponding filter coefficient h(0) is read from the ROM 62, the multiplier 63 multiplies X(8) by h(0) and the multiplication product data is supplied to the accumulator 64. At this time, no data exists in the accumulator 64. Thus, the following value obtained by multiplying the audio data X(8) by the filter coefficient h(0) is stored as is into the register 66:

A1=h(0)·X(8)

Then, the audio data X(6), X(4), and X(2) and their corresponding filter coefficients h(2), h(4), and h(6) are sequentially read from the RAM 61 and the ROM 62 respectively. The multiplier 63 multiplies X(6) by h(2), X(4) by h(4), and X(2) by h(6) and sequentially supplies each multiplication product data to the accumulator 64. Each multiplication product input is accumulated in the accumulator 64 and the following are sequentially stored into the register 66:

A2=h(2)·X(6)+A1

A3=h(4)·X(4)+A2

A4=h(6)·X(2)+A3

Eventually, the following data is stored into the register 66:

A4=h(0)·X(8)+h(2)·X(6)+h(4)·X(4)+h(6)·X(2)

This data is stored into the first register 68 via the first selector 67.

Next, when audio data X(7) is read from the RAM 61 and its corresponding filter coefficient h(1) is read from the ROM 62, the multiplier 63 multiplies X(7) by h(1) and the multiplication product data is supplied to the accumulator 64. At this time, the register 66 of the accumulator 64 has been cleared to zero. Thus, the following value obtained by multiplying the audio data X(7) by the filter coefficient h(1) is stored as is into the register 66:

B1=h(1)·X(7)

Then, the audio data X(5), X(3), and X(1) and their corresponding filter coefficients h(3), h(5), and h(7) are sequentially read from the RAM 61 and the ROM 62 respectively. Each product obtained by multiplying X(5) by h(3), X(3) by h(5), and X(1) by h(7) is sequentially supplied to the accumulator 64. Thus, the following are sequentially stored into the register 66:

B2=h(3)·X(5)+B1

B3=h(5)·X(3)+B2

B4=h(7)·X(1)+B3

Eventually, the following data is stored into the register 66:

B4=h(1)·X(7)+h(3)·X(5)+h(5)·X(3)+h(7)·X(1)

This data is stored into the second register 69 via the first selector 67.

From the first register 68 and the second register 69, respectively, the data A4 and B4 are input to the adder-subtracter 70 where A4 and B4 are added and B4 is subtracted from A4. After processed through the adder-subtracter 70, the adding calculation data:

$$A4 + B4 = h(6) \cdot X(2) + h(4) \cdot X(4) + h(2) \cdot X(6) + h(0) \cdot X(8) +$$
$$h(7) \cdot X(1) + h(5) \cdot X(3) + h(3) \cdot X(5) + h(1) \cdot X(7)$$

is stored into the first output register 71 as first band data Yb(4). Also, the subtracting calculation data:

$$A4 - B4 = h(6) \cdot X(2) + h(4) \cdot X(4) + h(2) \cdot X(6) + h(0) \cdot X(8) -$$
$$h(7) \cdot X(1) - h(5) \cdot X(3) - h(3) \cdot X(5) - h(1) \cdot X(7)$$

is stored into the first output register 71 as second band data Ya (4). As a result, the arithmetic operations expressed by equations (13) and (14) are at this point complete.

FIG. 4 shows an internal data flow timing chart when the digital filter shown in FIG. 2 functions as the synthesis filter, on the assumption that the number of taps N is "4," that is, n=4. In the synthesis filter mode, the first selector 67 selects band data Xa(n) and Xb(n) and the second selector 74 selects the adding/subtracting calculation data from the adder-subtracter 70.

Let us recalculate the above-mentioned equations (11) and (12), assuming the number of taps N=4. The calculation of the equation (11) will be as follows:

$$Y(2n) = h(0) \cdot \{Xa(n) - Xb(n)\} + h(2) \cdot \quad (15).$$
$$\{Xa(n-1) - Xb(n-1)\} + h(4) \cdot$$
$$\{Xa(n-2) - Xb(n-2)\} + h(6) \cdot$$
$$\{Xa(n-3) - Xb(n-3)\}$$

The calculation of the equation (12) will be as follows:

$$Y(2n+1) = h(1) \cdot \{Xa(n) - Xb(n)\} + h(3) \cdot \quad (16)$$
$$\{Xa(n-1) - Xb(n-1)\} + h(5) \cdot$$
$$\{Xa(n-2) - Xb(n-2)\} + h(7) \cdot$$
$$\{Xa(n-3) - Xb(n-3)\}$$

Two band data Xa(4) and Xb(4), which are alternately input to the digital filteron a time-sharing basis, are stored into the first register 68 and the second register 69, respectively, via the first selector 67. The adder-subtracter 70 subtracts the band data Xb(4) stored into the second register 69 from the band data Xa(4) stored into the first register 68. The subtracting calculation data {Xa(4) −Xb(4)} is written into the RAM 61 via the second selector 74. Although FIG. 4 omits the subtraction processing for band data Xa(1) to Xa(3) and Xb(1) to Xb(3), subtraction is executed in the same manner as done for the band data Xa(4) and Xb(4). After the band data Xa(1) to Xa(3) and Xb(1) to Xb(3) are stored into the first register 68 and the second register 69 respectively, the adder-subtracter 70 subtracts Xb(1) from Xa(1), Xb(2) from Xa(2), and Xb(3) from Xa(3). Then, it is assumed that the subtracting calculation data {Xa(1)−Xb(1)}, {Xa(2)−Xb(2)}, and {Xa(3)−Xb(3)} have also been stored into the RAM 61.

When the subtracting calculation data {Xa(4)−Xb(4)} is first read from the RAM 61 and its corresponding filter coefficient h(0) is read from the ROM 62, the multiplier 63 multiplies the data {Xa(4)−Xb(4)} by the filter coefficient h(0) and the multiplication product data is supplied to the accumulator 64. At this time, the register 66 of the accumulator 64 has been cleared to zero. Thus, the following value, that is, the product of the above multiplication, is stored as is into the register 66:

$$A1 = h(0) \cdot \{Xa(4) - Xb(4)\}$$

Then, the subtracting calculation data {Xa(3)−Xb(3)}, {Xa(2)−Xb(2)}, and {Xa(1)−Xb(1)} and their corresponding filter coefficients h(2), h(4), and h(6) are sequentially read from the RAM 61 and the ROM 62 respectively. The multiplier 63 multiplies {Xa(3)−Xb(3)} by h(2), {Xa(2)−Xb(2)} by h(4), {Xa(1)−Xb(1)} by h(6) and supplies each multiplication product data to the accumulator 64. Each multiplication product input is accumulated in the accumulator 64 and the following are sequentially stored into the register 66:

$$A2 = h(2) \cdot \{Xa(3) - Xb(3)\} + A1$$

$$A3 = h(4) \cdot \{Xa(2) - Xb(2)\} + A2$$

$$A4 = h(6) \cdot \{Xa(1) - Xb(1)\} + A3$$

Eventually, the following data is stored into the register 66:

$$A4 = h0 \cdot \{XA(4) - Xb(4)\} + h2 \cdot \{Xa(3) - Xb(3)\} + h(4) \cdot \{Xa(2) - Xb(2)\} + h(6) \cdot \{Xa(1) - Xb(1)\}$$

This data is stored into the second output register 72 as output data Y(8).

Next, the adder-subtracter 70 adds the band data Xa(4) stored into the first register 68 and the band data Xb(4) stored into the second register 69 and the adding calculation data {Xa(4)+Xb(4)} is written into the RAM 61 via the second selector 74. Although FIG. 4 omits the addition processing for band data Xa(1) to Xa(3) and Xb(1) to Xb(3), addition is executed in the same manner as done for the band data Xa(4) and Xb(4). After the band data Xa(1) to Xa(3) and Xb(1) to Xb(3) are stored into the first register 68 and the second register 69 respectively, the adder-subtracter 70 adds Xa(1) and Xb(1), Xa(2) and Xb(2), and Xa(3) and Xb(3). Then, it is assumed that the adding calculation data {Xa(1)+Xb(1)}, {Xa(2)+Xb(2)}, and {Xa(3)+Xb(3)} have also been stored into the RAM 61.

When the adding calculation data {Xa(4)+Xb(4)} is read from the RAM 61 and its corresponding filter coefficient h(1) is read from the ROM 62, the multiplier 63 multiplies the data {Xa(4)+Xb(4)} by the filter coefficient h(1) and the multiplication product data is supplied to the accumulator 64. At this time, no data exists in the accumulator 64. Thus, the following data, that is, the product of the above multiplication, is stored as is into the register 66:

$$B1 = h(1) \cdot \{Xa(4) + Xb(4)\}$$

Then, the adding calculation data {Xa(3)+Xb(3)}, {Xa(2)+Xb(2)}, and {Xa(1)+Xb(1)} and the filter coefficients h(3), h(5), and h(7) are sequentially read from the RAM 61 and the ROM 62 respectively. Each product obtained by multiplying {Xa(3)+Xb(3)} by h(3), {Xa(2)+Xb(2)} by h(5), {Xa(1)+Xb(1)} by h(7) is sequentially supplied to the accumulator 64. Thus, the following are sequentially stored into the register 66:

$$B2 = h(3) \cdot \{Xa(3) + Xb(3)\} + B1$$

$$B3 = h(5) \cdot \{Xa(2) + Xb(2)\} + B2$$

$$B4 = h(7) \cdot \{Xa(1) + Xb(1)\} + B3$$

Eventually, the following data is stored into the register 66:

$$B4 = h(1) \cdot \{Xa(4) + Xb(4)\} + h(3) \cdot \{Xa(3) + Xb(3)\} + h(5) \cdot \{Xa(2) + Xb(2)\} + h(7) \cdot \{Xa(1) + Xb(1)\}$$

This data is stored into the second output register 72 as audio data Y(9). As a result, the arithmetic operations expressed by the above-mentioned equations (15) and (16) have now been accomplished.

Figure 5:
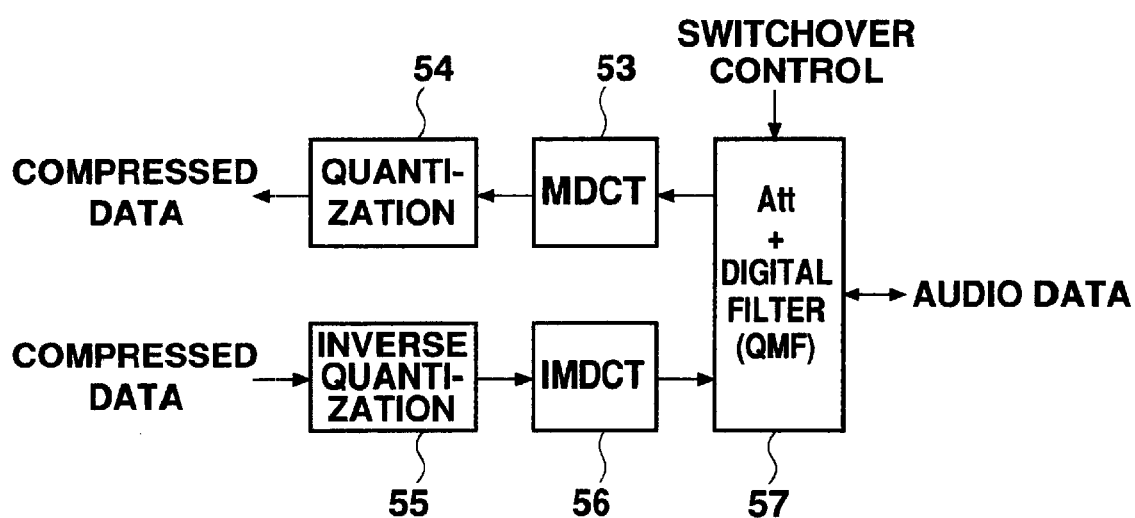
FIG. 5 is a block diagram showing an audio data compression/expansion apparatus configured according to a second embodiment of the present invention.

FIG. 5 is a block diagram showing an audio data compression/expansion apparatus configured in accordance with a second embodiment of the present invention. In FIG. 5, MDCT 53, quantization 54, inverse quantization 55, and IMDCT circuits correspond to those shown in FIG. 1, and their explanation will not be repeated.

The second embodiment of the present invention differs from the first embodiment in that an attenuation function is incorporated into a digital filter 57. In the second embodiment, part of the arithmetic circuitry (namely, the multiplier) that serves for processing audio data separation and band data synthesis is also used for processing audio data attenuation. Thus, the entire circuit size of a device configured in accordance with the second embodiment can be smaller than one in accordance with the first embodiment.

The digital filter 57, as the digital filter 52 shown in FIG. 1 does, executes audio data separation and band data synthesis by using the multiplier, accumulator, and adder-subtracter. The digital filter 57 attenuates audio data by using the multiplier also for multiplying audio data by an attenuation coefficient. In the digital filter 57, one unit of the arithmetic circuitry that consists of the multiplier, accumulator, and adder-subtracter, primarily provided for data separation and synthesis, namely, the multiplier also works for audio data attenuation processing. In this way, the digital filter can be provided with an additional attenuation function without adding a new arithmetic circuit to it.

This digital filter 57 is larger than the digital filter 52 shown in FIG. 1 in terms of the physical circuit size of a single digital filter because it has additional selectors for making the multiplier act as an attenuator. However, the digital filter 57 is capable of processing audio data attenuation in addition to audio data compression and band data expansion, and therefore, its effective circuit size can be considered as being smaller in the performance aspect.

Figure 6:
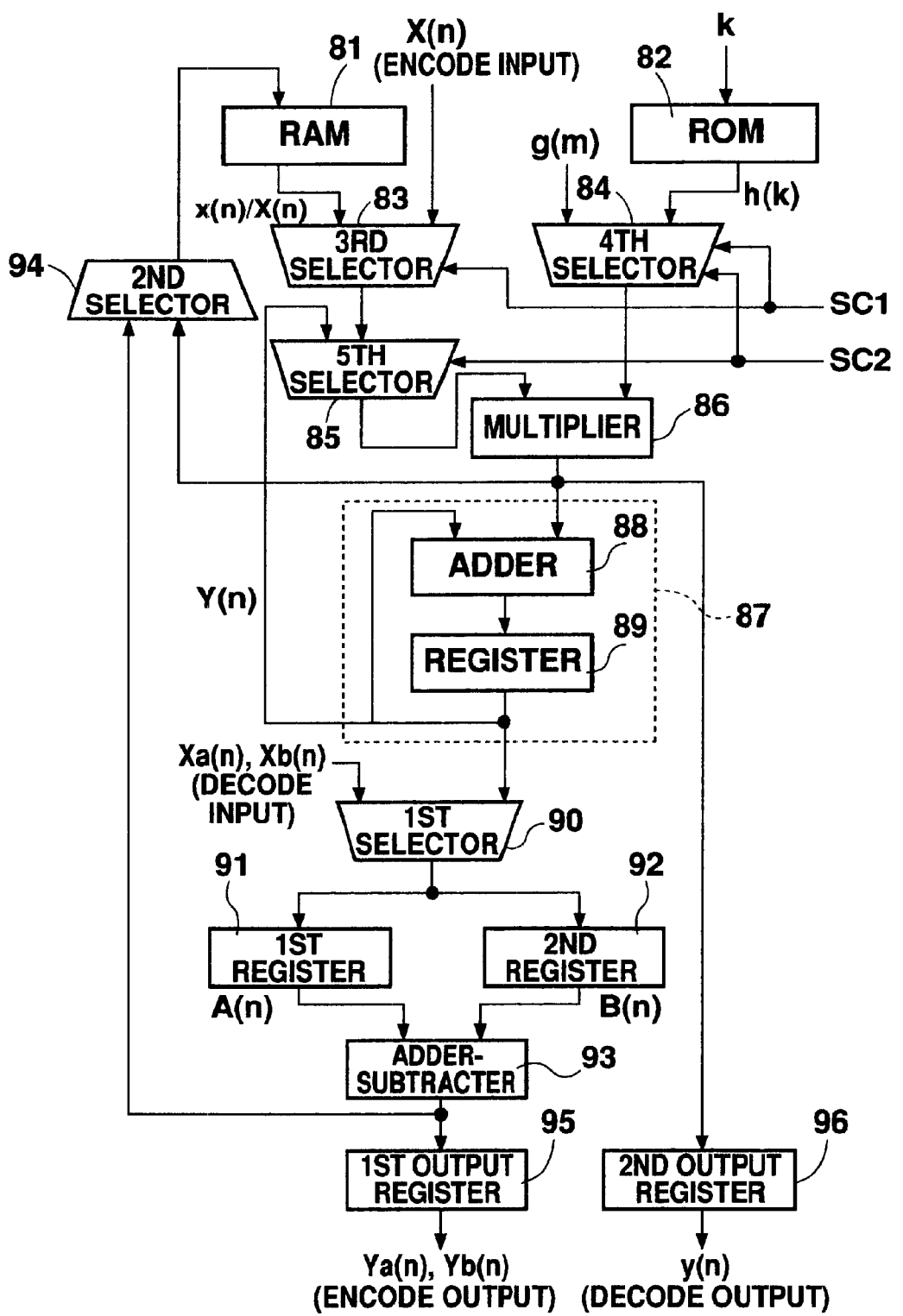
FIG. 6 is a block diagram showing the structure of a digital filter used in the audio data compression/expansion apparatus shown in FIG. 5.
Figure 7:
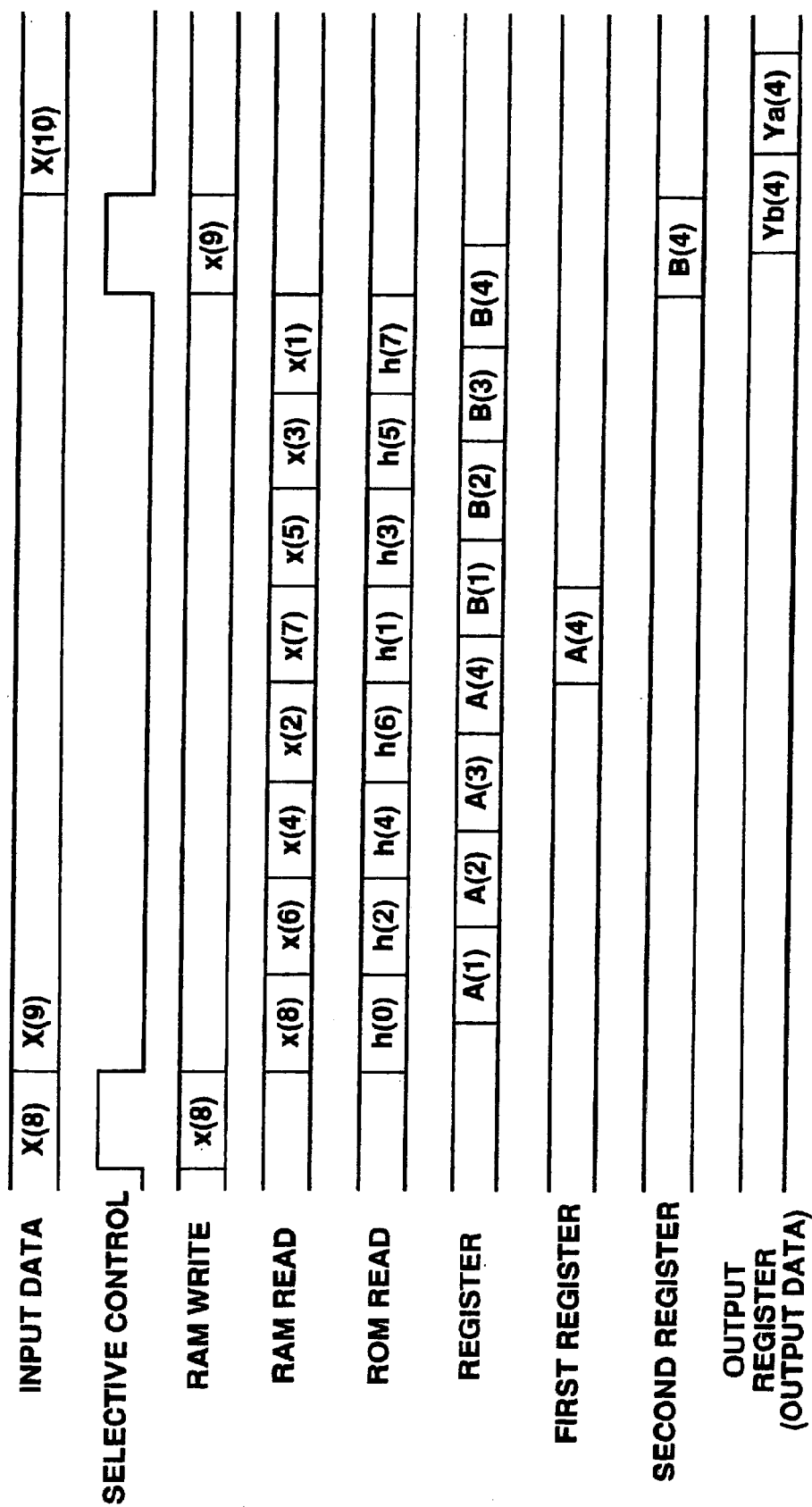
FIG. 7 is an internal data flow timing chart, intended to explain the data separating operation executed by the digital filter shown in FIG. 6.
Figure 8:
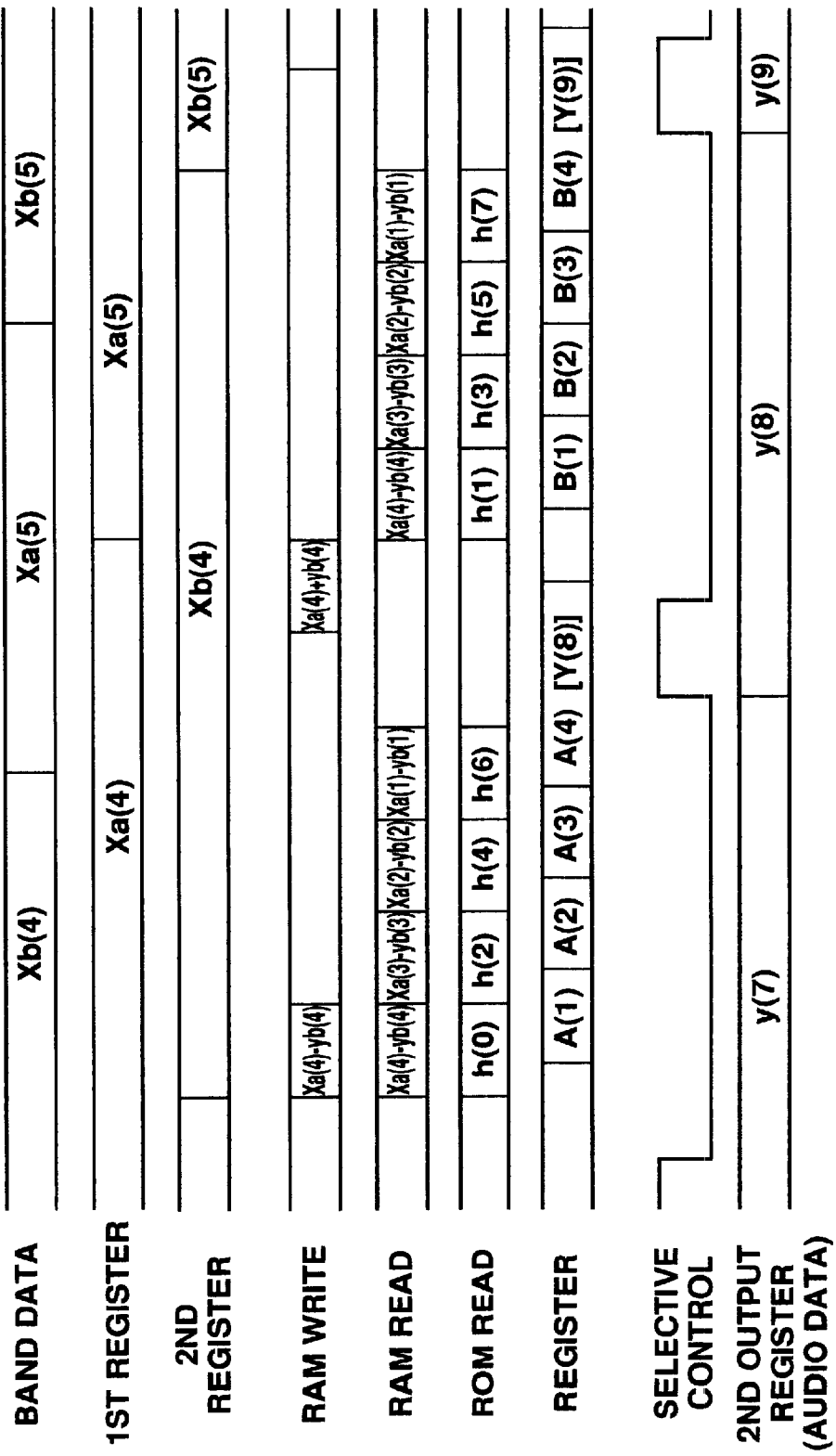
FIG. 8 is an internal data flow timing chart explaining the data synthesis operation executed by the digital filter shown in FIG. 6.
Figure 9:
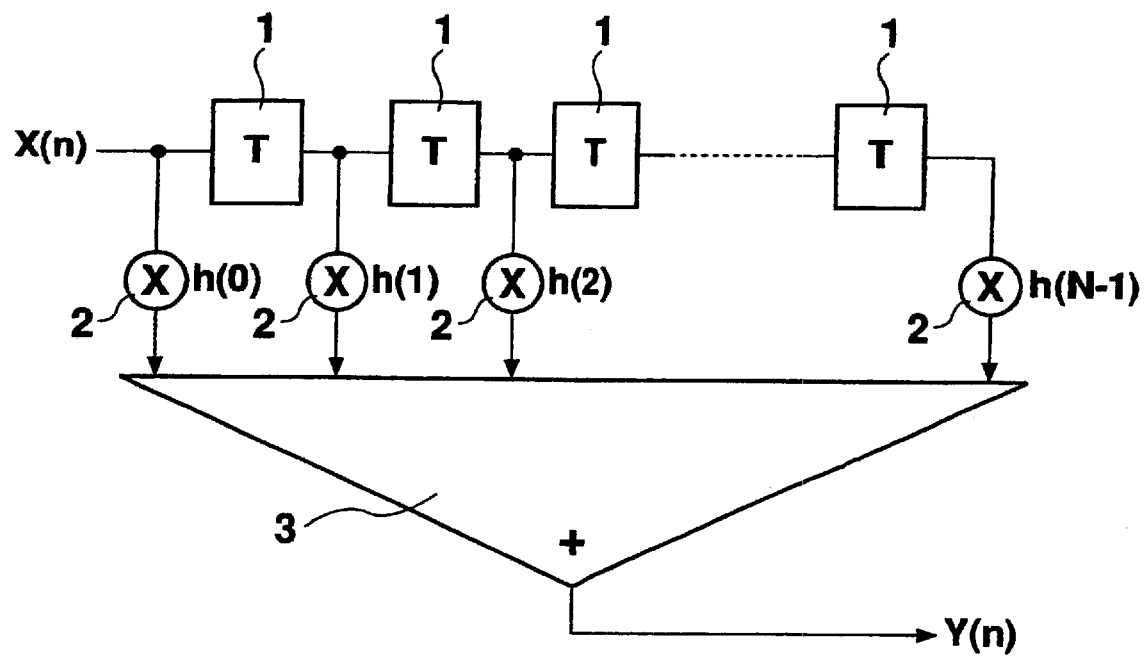
FIG. 9 is a circuit diagram showing the structure of an FIR type digital filter.
Figure 10:
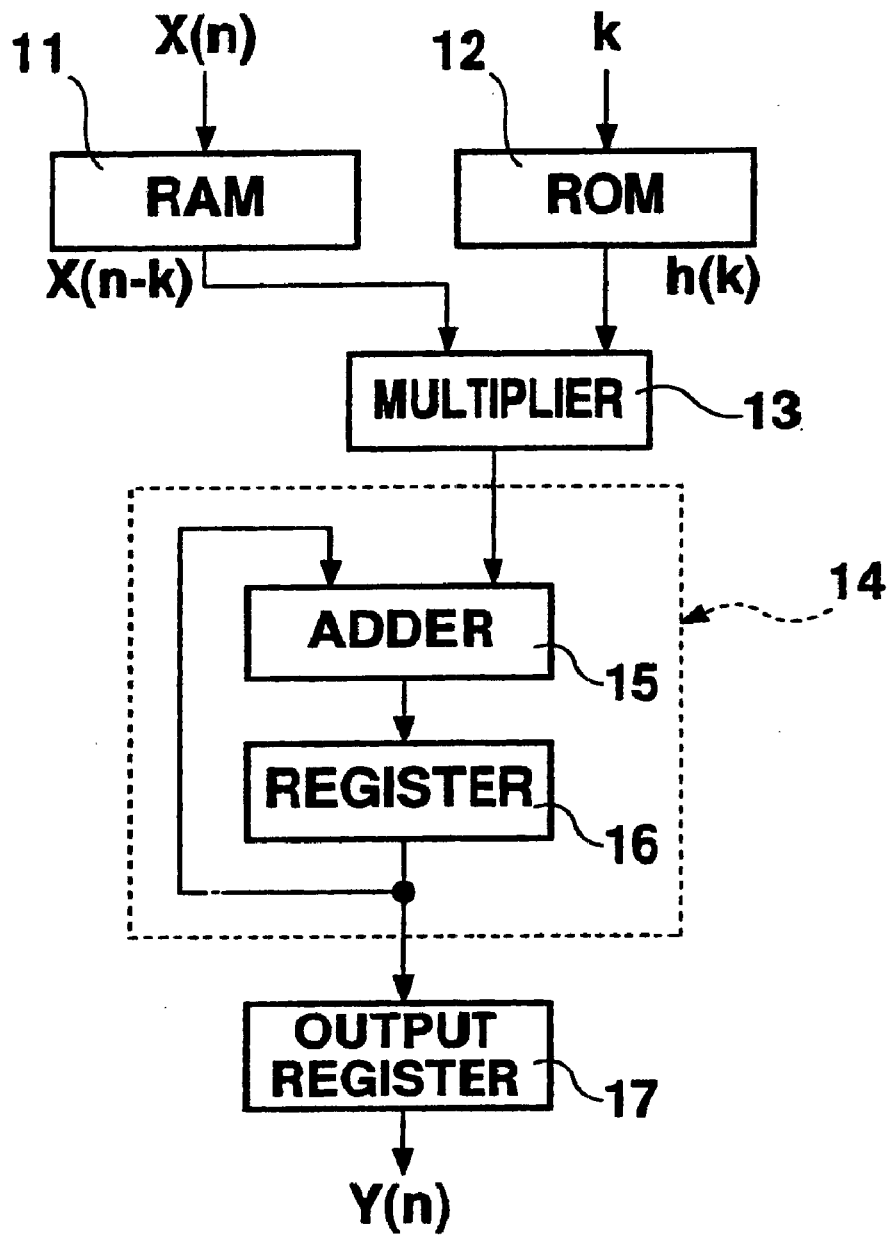
FIG. 10 is a block diagram showing the structure of a QMF based on the stored program method.
Figure 11:
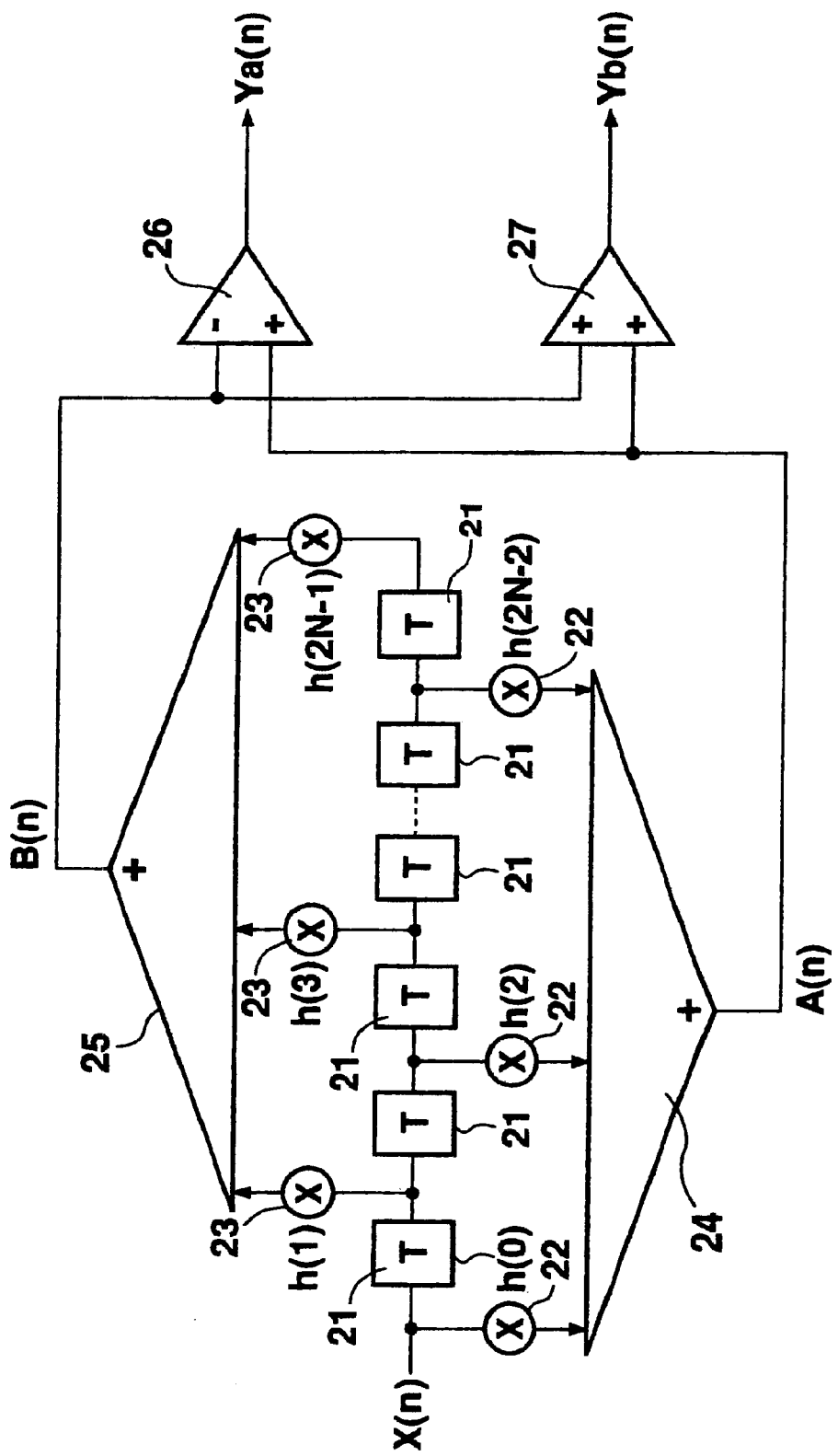
FIG. 11 is a circuit diagram showing the structure of a separation filter using the QMF.
Figure 12:
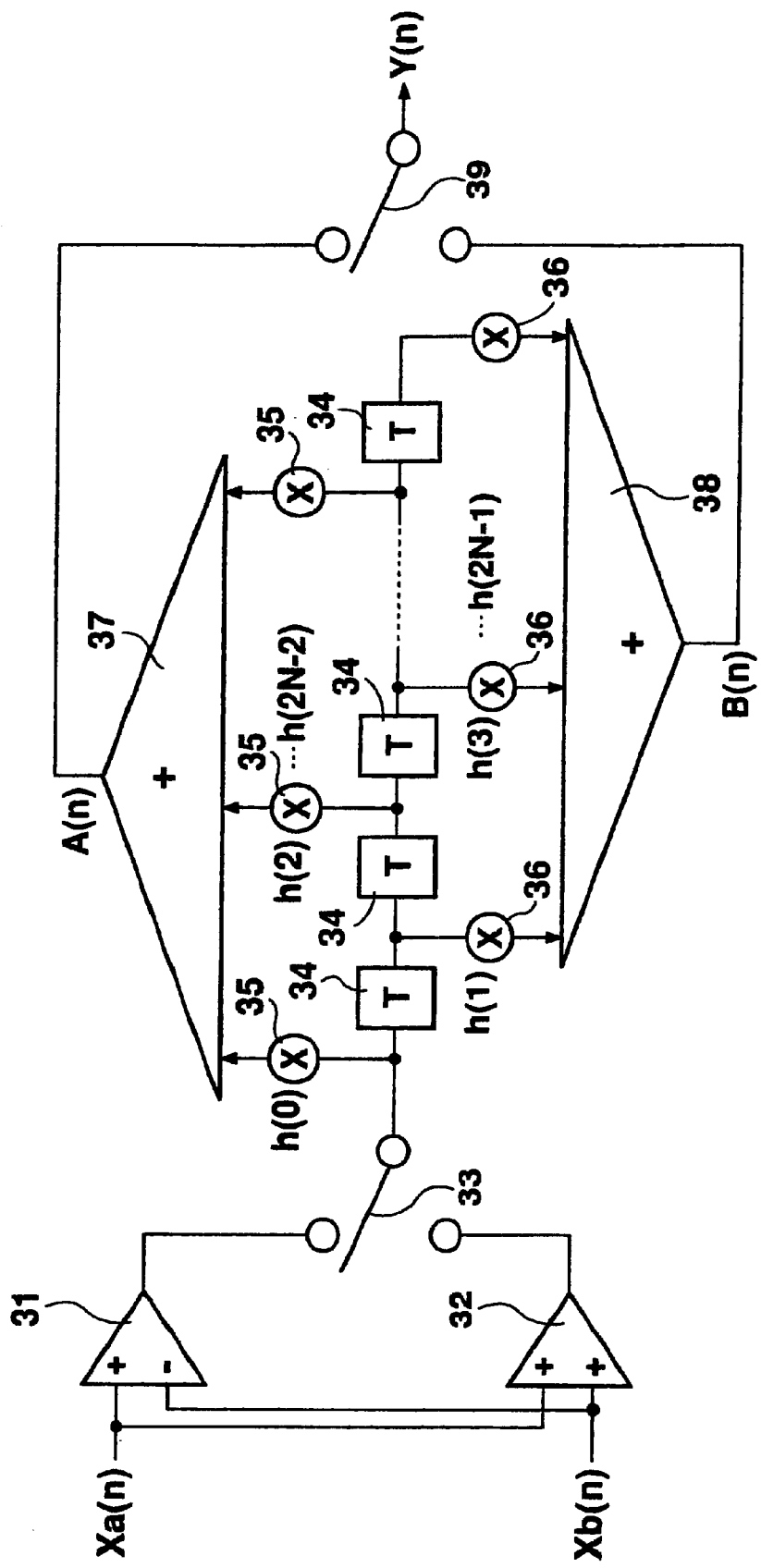
FIG. 12 is a circuit diagram showing the structure of a synthesis filter using the QMF.

FIG. 6 is a block diagram showing the structure of the digital filter 57 shown in FIG. 5. FIGS. 7 and 8 are internal data flow timing charts explaining the operation of the digital filter.

A RAM 81, connected to a second selector 94 described below, stores for a given period time-series data which has been input to it from the second selector 94. Each data stored in the RAM 81 is sequentially read out for its arithmetic processing step. From a ROM 82, in which a plurality of filter coefficients h(k) have previously been stored, a step-specific filter coefficient h(k) with a value of k incrementing step by step is read out repeatedly, where k corresponds to the k given in the above-mentioned equations (9) and (10).

A third selector 83, connected to the encode input and the RAM 81, selects and outputs either time-series audio data X(n) or the data read from the RAM 81. A fourth selector 84, connected to the attenuation input and the ROM 82, selects and outputs either an attenuation coefficient g(m) or a filter coefficient h(k) read from the ROM 82. A fifth selector 85, connected to the third selector 83 and an accumulator 87, selects and outputs either the data selected by the third selector 83 or the accumulation data from the accumulator 87. These third, fourth, and fifth selectors 83, 84, and 85 are placed under selective control in response to common selective control signals SC1 and SC2.

A multiplier 86, connected to the fifth selector 85 and the fourth selector 84, multiplies the data selected by the fifth selector 85 by the data selected by the fourth selector 84. The selectors are designed to operate as follows. When the third selector 83 selects audio data X(n), the fourth selector 84 selects an attenuation coefficient g(m). When the third selector 83 selects the data read from the RAM 81, the fourth selector 84 selects a filter coefficient h(k). When the fifth selector 85 selects the accumulation data, the fourth selector 84 selects an attenuation coefficient g(m). When the fifth selector 85 selects the data selected by the third selector 83, the fourth selector 84 operates so as to follow the selective action of the third selector 83. According to the actions of the above selectors, the multiplier 87 operates to multiply the data read from the RAM 81 by a filter coefficient h(k) and supply the multiplication product data to the accumulator 87, multiply audio data x(n) which has been input from the encode input by an attenuation coefficient g(m) to generate attenuated audio data x(n), or multiply audio data Y(n) which has been generated by the accumulator 87 and an attenuation coefficient g(m) to generate attenuated audio data y(n).

The accumulator 87, consisting of an adder 88 and a register 89, accumulates each multiplication product data which has been input to it from the multiplier 135 in accordance with the number of taps. This accumulator 87 is the same as the accumulator 64 shown in FIG. 1. A first selector 90, connected to the accumulator 87 and the decode input, selects and outputs either the accumulation data which has been input to it from the accumulator 87 or time-series band data Xa(n) and Xb(n). A first register 91 and a second register 92 are connected to the first selector 90. These registers 91 and 92 alternately receive and store the data which is continuously supplied from the first selector 90, so that either accumulation data or band data Xa(n) and Xb(n) is written into one of the registers. Then, the registers 91 and 92 output the stored data at a given timing, respectively. For example, these registers are designed such that data A(n), which is output from the first selector 90 at the first and other odd intervals, will be stored into the first register 91, and data B(n), which is output from the first selector 90 at the second and following even intervals, will be stored into the second register 92. An adder-subtracter 93, connected to the first register 91 and the second register 92, executes subtracting or adding calculation on the intermediate data A(n) and B(n) read from the registers 91 and 92. The second selector 94, connected to the adder-subtracter 93 and the multiplier 86, selects and outputs either the adding/subtracting calculation data which has been input to it from the adder-subtracter 93 or the multiplication product data which has been input to it from the multiplier 86.

A first output register 95, connected to the adder-subtracter 93, stores the adding/subtracting calculation data which has been supplied from the adder-subtracter 93 whenever the adder-subtracter completes the required arithmetic processing, and outputs band data Ya(n) and Yb(n). In response to the adder-subtracter 50 that repeats alternately addition and subtraction, for example, the first output register 95 outputs the subtracting calculation data as band data Ya(n) and the adding calculation data as band data Yb(n). The output from the first output register 95 becomes an encode output. A second output register 96, connected to the multiplier 86, stores the multiplication product data which has been output from the multiplier 86 whenever the multiplier completes the required arithmetic processing, and outputs attenuated audio data y(n). The output from the second output register 96 becomes a decode output.

The digital filter, with components as described above, acts as an attenuator and a separation filter when the first selector 90 selects the accumulation data from the accumulator 87 and the fifth selector 85 selects the data selected by the third selector 83. During this operation phase, the digital filter attenuates audio data X(n) to audio data x(n) and outputs band data Ya(n) and Yb(n) which have been produced by separating the attenuated audio data x(n) through the first output register 95. On the other hand, when the first selector selects band data Xa(n) and Xb(n) and the third selector 83 selects the data read from the RAM 81, the digital filter acts as a synthesis filter. During this operation phase, the digital filter synthesizes band data Xa(n) and Xb(n) to produce audio data Y(n), attenuates the audio data Y(n) to audio data y(n), and outputs the attenuated audio data y(n) through the second output register 96.

FIG. 7 shows an internal data flow timing chart when the digital filter shown in FIG. 6 functions as the separation filter, on the assumption that the number of taps N is "4," that is, n=4. During the separation filter mode, the first selector 90 selects the accumulation data supplied from the accumulator 87 and the fifth selector 85 selects the data selected by the third selector 83.

Initially, the third selector 83 selects audio data X(n) and the fourth selector 84 selects an attenuation coefficient g(m). During this state, when audio data X(8) is input to the digital filter, the multiplier 86 multiplies the audio data X(8) by an attenuation coefficient g(1) which determines the degree of attenuation of the audio data X(n) and is normally fixed to a given value. Then, the multiplication product data x(8) (=X(8)·g(1) is written into the RAM 81 as attenuated audio input data. Upon the completion of writing the attenuated audio data x(8) into the RAM 31, the third selector 83 changes to receiving the attenuated audio data x(8) (the input from the RAM 81) and the fourth selector 84 also changes to receiving a filter coefficient h(k) (the input from the ROM 82).

Processing of the attenuated audio data x(8) after the completion of the changeover of the third and the fourth selectors 83 and 84 is carried out in the same way as shown in FIG. 3. As a result, the arithmetic operations expressed by equations (13) and (14) are now complete, provided the attenuated audio data x(n) substitutes for audio data X(n). From the audio data X(n) after attenuation, two band data Ya(n) and Yb(n) are generated.

FIG. 8 shows an internal data flow timing chart when the digital filter shown in FIG. 6 functions as the synthesis filter, on the assumption that the number of taps N is "4," that is, n=4. During the synthesis filter mode, the first selector 90 selects audio data Xa(n) and Xb(n) supplied from the decode input and the third selector 83 selects the data read from the RAM 81.

Initially, the fourth selector 84 selects a filter coefficient h(k) and the fifth selector 85 selects the data selected by the third selector, that is, the data read from the RAM 81. This operation aspect is the same as when the digital filter shown in FIG. 2 operates as the separation filter and the processing of audio data Xa(n) and Xb(n) which have been input to the first selector 90 from the decode input until audio data Y(n) has been generated is the same as shown in FIG. 4. For the time intervals between the data accumulations executed by the accumulator 87, that is, accumulating the required number of data as many as the number of taps, however, a longer time than required in the case shown in FIG. 4 must be set in order to ensure sufficient time for the multiplier 86 to multiply the data by an attenuation coefficient g(m). Thus, the arithmetic operations expressed by equations (15) and (16) are at this point complete.

After the generation of audio data Y(n), the fifth selector 85 switches to receiving audio data Y(n) (the input from the accumulator 87) and the fourth selector 84 switches to receiving an attenuation coefficient g(m). Under this condition, when audio data Y(8) is output from the accumulator 87, the multiplier 86 multiplies the audio data Y(8) by an attenuation coefficient g(1) and the multiplication product data y(8) (=Y(8)·g(1)) is stored into the second output register 96 as attenuated audio data. After two audio data Xa(n) and Yb(n) are synthesized into audio data Y(n), consequently, the attenuated audio data y(n) is generated which has been attenuated to a desired level.

Although the above descriptions describe cases where the digital filters have four taps, it is trivial to set up a digital filter with five or more taps without changing its circuit structure, by simply altering the operation timing.

According to the present invention, a digital filter is designed to perform processing both audio data separation and band data synthesis by the switchover of the selectors installed in its circuitry. Thus, only a single digital filter and a single attenuator can achieve the required capability of an audio data compression/expansion apparatus and the reduction of the entire circuit size of the device is feasible. Furthermore, even smaller circuit of such device can be expected by elaborating the device configuration in which the attenuator uses the same multiplier that is one of the components of the digital filter.

What is claimed is:

1. A digital filter that separates audio data into a plurality of band d data and synthesizes a plurality of band data into audio data, comprising:

a RAM which sequentially stores time-series data; a multiplier for multiplying the data read from said RAM by a given filter coefficient;

an accumulator for accumulating the product of multiplication executed by said multiplier;

a first selector which selects the sum of accumulation executed by said accumulator when data separation is executed or first and second band data when data synthesis is executed; first and second registers which alternately receive and store the data selected by said selector;

an adder-subtracter for adding or subtracting calculation on two different data outputs from said first and second registers; and a second selector which selects the result of arithmetic executed by said adder-subtracter when data separation is executed or audio data when data synthesis is executed and supplies the selected one to said RAM, wherein said multiplier also multiplies audio data by a given attenuation coefficient and the multiplication product data is stored into said RAM, and said digital filter outputs the result of arithmetic executed by said adder-subtracter as band data produced from said audio data, and the sum of accumulation executed by said accumulator, after multiplication by a given attenuation coefficient through said multiplier, as audio data produced from said first and second band data.

2. The digital filter according to claim 1, further comprising:

a third selector which selects and supplies to said multiplier either said audio data or the output from said RAM; and a fourth selector which selects and supplies to said multiplier either said filter coefficient or said attenuation coefficient.

3. The digital filter according to claim 2, further including:

a fifth selector which selects and supplies to said multiplier either the selective output from said third selector or the sum of accumulation executed by said accumulator.

\* \* \* \* \*

UNITED STATES PATENT AND TRADEMARK OFFICE
CERTIFICATE OF CORRECTION

PATENT NO. : 6,363,406 B1
DATED : March 26, 2002
INVENTOR(S) : Takano et al.

It is certified that error appears in the above-identified patent and that said Letters Patent is hereby corrected as shown below:

Column 1,
Line 8, after "to" delete "expands" and insert therefor -- expand --.
Line 10, after "filter" insert therefor -- is --.

Column 5,
Line 35, after "and" (first occurence) delete "a" and insert therefor -- an --.

Column 7,
Line 14, after "synthesis" delete "possessing" and insert therefor -- processing --.
Line 43, after "the" (first occurrence) delete "strucutre" and insert therefor -- structure --.
Line 44, before "filter" delete "digtal" and insert therefor -- digital --.

Column 8,
Line 1, after "adder" delete "55" and insert therefor -- 65 --.

Column 10,
Line 66, after "digital" delete "filteron" and insert therefor -- filter on --.

Column 16,
Line 3, after "band" delete "d".

Signed and Sealed this

Sixth Day of September, 2005

JON W. DUDAS
*Director of the United States Patent and Trademark Office*